(12) United States Patent
Salter et al.

(10) Patent No.: US 9,143,126 B2
(45) Date of Patent: Sep. 22, 2015

(54) PROXIMITY SWITCH HAVING LOCKOUT CONTROL FOR CONTROLLING MOVABLE PANEL

(75) Inventors: Stuart C. Salter, White lake, MI (US); Anna Hill, Belleville, MI (US); Jeffrey Singer, Canton, MI (US); Cornel Lewis Gardner, Romulus, MI (US); Beatriz Esthela Padilla, Westland, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 966 days.

(21) Appl. No.: 13/240,394

(22) Filed: Sep. 22, 2011

(65) Prior Publication Data

US 2013/0076121 A1  Mar. 28, 2013

(51) Int. Cl.
*G01R 27/32*  (2006.01)
*H03K 17/955* (2006.01)
*B60J 7/057*  (2006.01)

(52) U.S. Cl.
CPC ............ *H03K 17/955* (2013.01); *B60J 7/0573* (2013.01); *Y10T 307/766* (2015.04)

(58) Field of Classification Search
CPC ............................... G01R 27/04; G01R 27/22
USPC ............... 324/647, 606, 665, 672, 679, 705, 324/76.39, 76.41, 76.56, 76.2, 520, 527, 324/340, 702
See application file for complete search history.

(56) References Cited

U.S. PATENT DOCUMENTS

| | | | |
|---|---|---|---|
| 3,382,588 A | 5/1968 | Serrell et al. | |
| 3,544,804 A | 12/1970 | Gaumer et al. | |
| 3,691,396 A | 9/1972 | Hinrichs | |
| 3,707,671 A | 12/1972 | Morrow et al. | |
| 3,725,589 A | 4/1973 | Golden | |
| 3,826,979 A | 7/1974 | Steinmann | |
| 4,204,204 A | 5/1980 | Pitstick | |
| 4,205,325 A | 5/1980 | Haygood et al. | |
| 4,232,289 A | 11/1980 | Daniel | |
| 4,257,117 A | 3/1981 | Besson | |
| 4,290,052 A | 9/1981 | Eichelberger et al. | |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

(Continued)

*Primary Examiner* — Arleen M Vazquez
*Assistant Examiner* — Dominic Hawkins
(74) *Attorney, Agent, or Firm* — Vichit Chea; Price Heneveld LLP

(57) ABSTRACT

A vehicle proximity switch and method are provided having lockout control for controlling a movable panel on a vehicle. The switch includes a proximity sensor such, as a capacitive sensor, installed in a vehicle and providing a sense activation field. The proximity switch also includes control circuitry for processing the sense activation field to sense user activation of the switch and controls functionality when one or more lockout sensors are activated.

19 Claims, 4 Drawing Sheets

(56) References Cited

U.S. PATENT DOCUMENTS

| | | | |
|---|---|---|---|
| 4,340,813 A | 7/1982 | Sauer |
| 4,374,381 A | 2/1983 | Ng et al. |
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,801,340 A * | 9/1998 | Peter .......................... 178/20.04 |
| 5,825,352 A | 10/1998 | Bisset et al. |
| 5,827,980 A | 10/1998 | Doemens et al. |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 | 6/2002 | Boisvert et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 | 3/2003 | Engle et al. |
| 6,537,359 B1 | 3/2003 | Spa |
| 6,538,579 B1 * | 3/2003 | Yoshikawa et al. ........... 340/928 |
| 6,559,902 B1 | 5/2003 | Kusuda et al. |
| 6,587,097 B1 | 7/2003 | Aufderheide et al. |
| 6,603,306 B1 * | 8/2003 | Olsson et al. ............ 324/207.26 |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 * | 11/2003 | Fukazawa et al. ............. 318/445 |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B2 | 8/2005 | Kuribayashi |
| 6,940,291 B1 | 9/2005 | Ozick |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |

(56) References Cited

U.S. PATENT DOCUMENTS

| | | |
|---|---|---|
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | McCall |
| 7,248,955 B2 | 7/2007 | Hein et al. |
| 7,254,775 B2 | 8/2007 | Geaghan et al. |
| 7,255,466 B2 * | 8/2007 | Schmidt et al. ............... 362/501 |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 | 3/2008 | Ide et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 * | 11/2008 | Goldbeck et al. ............... 701/36 |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,454,181 B2 | 6/2013 | Salter et al. |
| 8,456,180 B2 | 6/2013 | Sitarski |
| 8,508,487 B2 | 8/2013 | Schwesig et al. |
| 8,517,383 B2 | 8/2013 | Wallace et al. |
| 8,537,107 B1 | 9/2013 | Li |
| 8,570,053 B1 | 10/2013 | Ryshtun et al. |
| 8,659,414 B1 | 2/2014 | Schuk |
| 8,908,034 B2 | 12/2014 | Bordonaro |
| 8,933,708 B2 | 1/2015 | Buttolo et al. |
| 8,981,265 B2 | 3/2015 | Jiao et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2003/0189211 A1 | 10/2003 | Dietz |
| 2004/0056753 A1 | 3/2004 | Chiang et al. |
| 2004/0090195 A1 | 5/2004 | Motsenbocker |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 * | 1/2005 | Gifford et al. ............... 318/466 |
| 2005/0052429 A1 | 3/2005 | Philipp |
| 2005/0068045 A1 * | 3/2005 | Inaba et al. ............... 324/678 |
| 2005/0068712 A1 * | 3/2005 | Schulz et al. ............... 361/287 |
| 2005/0073425 A1 * | 4/2005 | Snell et al. ............... 340/686.6 |
| 2005/0088417 A1 | 4/2005 | Mulligan |
| 2005/0092097 A1 * | 5/2005 | Shank et al. ............... 73/780 |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2005/0283280 A1 * | 12/2005 | Evans, Jr. ............... 701/1 |
| 2006/0022682 A1 | 2/2006 | Nakamura et al. |
| 2006/0038793 A1 | 2/2006 | Philipp |
| 2006/0044800 A1 | 3/2006 | Reime |
| 2006/0055534 A1 * | 3/2006 | Fergusson ............... 340/562 |
| 2006/0082545 A1 | 4/2006 | Choquet et al. |
| 2006/0170241 A1 | 8/2006 | Yamashita |
| 2006/0238518 A1 | 10/2006 | Westerman et al. |
| 2006/0238521 A1 | 10/2006 | Westerman et al. |
| 2006/0244733 A1 | 11/2006 | Geaghan |
| 2006/0250142 A1 * | 11/2006 | Abe ............... 324/663 |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |

(56) References Cited

U.S. PATENT DOCUMENTS

| | | | |
|---|---|---|---|
| 2007/0103431 A1 | 5/2007 | Tabatowski-Bush | |
| 2007/0206668 A1 | 9/2007 | Jin | |
| 2007/0226994 A1 | 10/2007 | Wollach et al. | |
| 2007/0232779 A1 | 10/2007 | Moody et al. | |
| 2007/0247429 A1 | 10/2007 | Westerman | |
| 2007/0255468 A1 | 11/2007 | Strebel et al. | |
| 2007/0257891 A1 | 11/2007 | Esenther et al. | |
| 2007/0271072 A1 | 11/2007 | Kovacevich | |
| 2007/0296709 A1 | 12/2007 | GuangHai | |
| 2008/0012835 A1 | 1/2008 | Rimon et al. | |
| 2008/0018604 A1 | 1/2008 | Paun et al. | |
| 2008/0023715 A1 | 1/2008 | Choi | |
| 2008/0030465 A1 | 2/2008 | Konet et al. | |
| 2008/0074398 A1 | 3/2008 | Wright | |
| 2008/0111714 A1 | 5/2008 | Kremin | |
| 2008/0136792 A1 | 6/2008 | Peng et al. | |
| 2008/0142352 A1 | 6/2008 | Wright | |
| 2008/0143681 A1 | 6/2008 | XiaoPing | |
| 2008/0150905 A1 | 6/2008 | Grivna et al. | |
| 2008/0158146 A1 | 7/2008 | Westerman | |
| 2008/0196945 A1 | 8/2008 | Konstas | |
| 2008/0202912 A1 | 8/2008 | Boddie et al. | |
| 2008/0231290 A1 | 9/2008 | Zhitomirsky | |
| 2008/0238650 A1 | 10/2008 | Riihimaki et al. | |
| 2008/0246723 A1 | 10/2008 | Baumbach | |
| 2008/0257706 A1 | 10/2008 | Haag | |
| 2008/0272623 A1 | 11/2008 | Kadzban et al. | |
| 2009/0066659 A1 | 3/2009 | He et al. | |
| 2009/0079699 A1 | 3/2009 | Sun | |
| 2009/0108985 A1 | 4/2009 | Haag et al. | |
| 2009/0115731 A1 | 5/2009 | Rak | |
| 2009/0120697 A1 | 5/2009 | Wilner et al. | |
| 2009/0135157 A1 | 5/2009 | Harley | |
| 2009/0212849 A1 | 8/2009 | Reime | |
| 2009/0225043 A1 | 9/2009 | Rosener | |
| 2009/0235588 A1 | 9/2009 | Patterson et al. | |
| 2009/0236210 A1 | 9/2009 | Clark et al. | |
| 2009/0251435 A1 | 10/2009 | Westerman et al. | |
| 2009/0256578 A1 | 10/2009 | Wuerstlein et al. | |
| 2009/0256677 A1 | 10/2009 | Hein et al. | |
| 2009/0273563 A1 | 11/2009 | Pryor | |
| 2009/0295409 A1 | 12/2009 | Irkliy | |
| 2009/0295556 A1* | 12/2009 | Inoue et al. | 340/438 |
| 2009/0309616 A1 | 12/2009 | Klinghult et al. | |
| 2010/0001746 A1 | 1/2010 | Duchene et al. | |
| 2010/0001974 A1 | 1/2010 | Su et al. | |
| 2010/0007613 A1 | 1/2010 | Costa | |
| 2010/0007620 A1 | 1/2010 | Hsieh et al. | |
| 2010/0013777 A1 | 1/2010 | Baudisch et al. | |
| 2010/0026654 A1 | 2/2010 | Suddreth | |
| 2010/0039392 A1 | 2/2010 | Pratt et al. | |
| 2010/0066391 A1 | 3/2010 | Hirasaka et al. | |
| 2010/0090712 A1 | 4/2010 | Vandermeijden | |
| 2010/0090966 A1 | 4/2010 | Gregorio | |
| 2010/0102830 A1 | 4/2010 | Curtis et al. | |
| 2010/0103139 A1 | 4/2010 | Soo et al. | |
| 2010/0110037 A1 | 5/2010 | Huang et al. | |
| 2010/0117970 A1* | 5/2010 | Burstrom et al. | 345/173 |
| 2010/0125393 A1 | 5/2010 | Jarvinen et al. | |
| 2010/0156814 A1 | 6/2010 | Weber et al. | |
| 2010/0177057 A1 | 7/2010 | Flint et al. | |
| 2010/0188356 A1 | 7/2010 | Vu et al. | |
| 2010/0188364 A1 | 7/2010 | Lin et al. | |
| 2010/0194692 A1 | 8/2010 | Orr et al. | |
| 2010/0207907 A1 | 8/2010 | Tanabe et al. | |
| 2010/0212819 A1 | 8/2010 | Salter et al. | |
| 2010/0214253 A1 | 8/2010 | Wu et al. | |
| 2010/0219935 A1 | 9/2010 | Bingle et al. | |
| 2010/0241431 A1 | 9/2010 | Weng et al. | |
| 2010/0241983 A1 | 9/2010 | Walline et al. | |
| 2010/0245286 A1 | 9/2010 | Parker | |
| 2010/0250071 A1 | 9/2010 | Pala et al. | |
| 2010/0277431 A1 | 11/2010 | Klinghult | |
| 2010/0280983 A1 | 11/2010 | Cho et al. | |
| 2010/0286867 A1 | 11/2010 | Bergholz et al. | |
| 2010/0289754 A1 | 11/2010 | Sleeman et al. | |
| 2010/0289759 A1 | 11/2010 | Fisher et al. | |
| 2010/0296303 A1 | 11/2010 | Sarioglu et al. | |
| 2010/0302200 A1 | 12/2010 | Netherton et al. | |
| 2010/0315267 A1 | 12/2010 | Chung et al. | |
| 2010/0321214 A1 | 12/2010 | Wang et al. | |
| 2010/0321321 A1 | 12/2010 | Shenfield et al. | |
| 2010/0321335 A1 | 12/2010 | Lim et al. | |
| 2010/0328261 A1 | 12/2010 | Woolley et al. | |
| 2010/0328262 A1 | 12/2010 | Huang et al. | |
| 2011/0001707 A1 | 1/2011 | Faubert et al. | |
| 2011/0001722 A1 | 1/2011 | Newman et al. | |
| 2011/0007021 A1 | 1/2011 | Bernstein et al. | |
| 2011/0007023 A1 | 1/2011 | Abrahamsson et al. | |
| 2011/0012623 A1 | 1/2011 | Gastel et al. | |
| 2011/0018744 A1 | 1/2011 | Philipp | |
| 2011/0018817 A1 | 1/2011 | Kryze et al. | |
| 2011/0022393 A1 | 1/2011 | Waller et al. | |
| 2011/0031983 A1 | 2/2011 | David et al. | |
| 2011/0034219 A1 | 2/2011 | Filson et al. | |
| 2011/0037725 A1 | 2/2011 | Pryor | |
| 2011/0037735 A1 | 2/2011 | Land et al. | |
| 2011/0039602 A1 | 2/2011 | McNamara et al. | |
| 2011/0041409 A1 | 2/2011 | Newman et al. | |
| 2011/0043481 A1 | 2/2011 | Bruwer | |
| 2011/0050251 A1 | 3/2011 | Franke et al. | |
| 2011/0050587 A1 | 3/2011 | Natanzon et al. | |
| 2011/0050618 A1 | 3/2011 | Murphy et al. | |
| 2011/0050620 A1 | 3/2011 | Hristov | |
| 2011/0055753 A1 | 3/2011 | Horodezky et al. | |
| 2011/0057899 A1 | 3/2011 | Sleeman et al. | |
| 2011/0062969 A1 | 3/2011 | Hargreaves et al. | |
| 2011/0063425 A1 | 3/2011 | Tieman | |
| 2011/0074573 A1 | 3/2011 | Seshadri | |
| 2011/0080365 A1 | 4/2011 | Westerman | |
| 2011/0080366 A1 | 4/2011 | Bolender | |
| 2011/0080376 A1 | 4/2011 | Kuo et al. | |
| 2011/0082616 A1 | 4/2011 | Small et al. | |
| 2011/0083110 A1 | 4/2011 | Griffin et al. | |
| 2011/0095997 A1 | 4/2011 | Philipp | |
| 2011/0115732 A1 | 5/2011 | Coni et al. | |
| 2011/0115742 A1 | 5/2011 | Sobel et al. | |
| 2011/0134047 A1 | 6/2011 | Wigdor et al. | |
| 2011/0134054 A1 | 6/2011 | Woo et al. | |
| 2011/0139934 A1* | 6/2011 | Giesa et al. | 244/137.2 |
| 2011/0141006 A1 | 6/2011 | Rabu | |
| 2011/0141041 A1 | 6/2011 | Parkinson et al. | |
| 2011/0148803 A1 | 6/2011 | Xu | |
| 2011/0157037 A1 | 6/2011 | Shamir et al. | |
| 2011/0157079 A1 | 6/2011 | Wu et al. | |
| 2011/0157080 A1 | 6/2011 | Ciesla et al. | |
| 2011/0157089 A1 | 6/2011 | Rainisto | |
| 2011/0161001 A1 | 6/2011 | Fink | |
| 2011/0163764 A1* | 7/2011 | Shank et al. | 324/658 |
| 2011/0169758 A1 | 7/2011 | Aono | |
| 2011/0187492 A1 | 8/2011 | Newman et al. | |
| 2011/0210755 A1* | 9/2011 | Ogawa | 324/686 |
| 2011/0279276 A1 | 11/2011 | Newham | |
| 2011/0279409 A1 | 11/2011 | Salaverry et al. | |
| 2011/0309912 A1 | 12/2011 | Muller | |
| 2012/0007821 A1 | 1/2012 | Zaliva | |
| 2012/0037485 A1* | 2/2012 | Sitarski | 200/600 |
| 2012/0043973 A1 | 2/2012 | Kremin | |
| 2012/0043976 A1 | 2/2012 | Bokma et al. | |
| 2012/0049870 A1 | 3/2012 | Salter et al. | |
| 2012/0055557 A1 | 3/2012 | Belz et al. | |
| 2012/0062247 A1 | 3/2012 | Chang | |
| 2012/0062498 A1 | 3/2012 | Weaver et al. | |
| 2012/0068956 A1 | 3/2012 | Jira et al. | |
| 2012/0104790 A1* | 5/2012 | Plavetich et al. | 296/146.16 |
| 2012/0154324 A1 | 6/2012 | Wright et al. | |
| 2012/0217147 A1 | 8/2012 | Porter et al. | |
| 2012/0312676 A1 | 12/2012 | Salter et al. | |
| 2012/0313648 A1 | 12/2012 | Salter et al. | |
| 2012/0313767 A1 | 12/2012 | Sitarski | |
| 2012/0319992 A1 | 12/2012 | Lee | |
| 2013/0024169 A1 | 1/2013 | Veerasamy | |
| 2013/0033356 A1 | 2/2013 | Sitarski et al. | |
| 2013/0036529 A1 | 2/2013 | Salter et al. | |

(56) References Cited

U.S. PATENT DOCUMENTS

| | | |
|---|---|---|
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0170013 A1 | 7/2013 | Tonar et al. |
| 2013/0270896 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |
| 2014/0145733 A1 | 5/2014 | Buttolo et al. |
| 2014/0252879 A1 | 9/2014 | Dassanayake et al. |
| 2014/0306723 A1 | 10/2014 | Salter |
| 2014/0306724 A1 | 10/2014 | Dassanayake et al. |
| 2015/0077227 A1 | 3/2015 | Salter et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 611858515 | 8/1986 |
| JP | 40650358 | 3/1992 |
| JP | 047082416 | 3/1992 |
| JP | 07315880 | 12/1995 |
| JP | 11065764 | 3/1999 |
| JP | 11110131 | 4/1999 |
| JP | 08138446 | 5/1999 |
| JP | 112601333 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 A | 12/2004 |
| KR | 20090127544 | 12/2009 |
| KR | 20100114768 A | 10/2010 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012032318 A1 | 3/2012 |
| WO | 2012169106 | 12/2012 |
| WO | 2012169106 A1 | 12/2012 |

OTHER PUBLICATIONS

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

Kliffken, Markus G. et al., SAE International Technical Papers, "Obstacle Detection for Power Operated Window-Lift and Sunroof Actuation Systems," Paper No. 2001-01-0466, published Mar. 5, 2001, 1 page.

"Touch Sensors Design Guide" by ATMEL, 10620 D-AT42-04/09, Revised Apr. 2009, 72 pages, Copyrighted 2008-2009 Atmel Corporation.

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

Van Ess, Dave et al., "Capacitive Touch Switches for Automotive Applications," 7 pages, Published in Automotive DesignLine, www.automotiedesignline.com, Feb. 2006.

"Introduction to Touch Solutions, White Paper, Rivision 1.0 A," Densitron Corporation, 14 pages, Aug. 21, 2007.

"CLEVIOS P Formulation Guide," 12 pages, www.clevios.com, Heraeus Clevios GmbH, no date provided.

"Orgacon EL-P3000, Screen printing Ink Series 3000," 2 pages, AGFA, last updated in Feb. 2006.

NXP Capacitive Sensors, 1 page, www.nxp.com, copyrighted 2006-2010, NXP Semiconductors.

"Moisture Immunity in QuickSense Studio," AN552, Rev. 0.1 Oct. 2010, 8 pages, Silicon Laboratories, Inc., © 2010.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

JVC KD-AVX777 Detachable Front-Panel with Integrated 5.4" Touch-Screen Monitor, 6 pages, www.crutchfield.com, no date provided.

Ergonomic Palm Buttons, Pepperl +Fuchs, www.wolfautomation.com, 6 pages, no date provided.

U.S. Appl. No. 14/518,141, filed Oct. 20, 2014, entitled "Directional Proximity Switch Assemby," (23 pages of specification and 13 pages of drawings) and Official Filing Receipt (3 pages).

U.S. Appl. No. 14/552,809, filed Nov. 25, 2014, entitled "Proximity Switch Based Door Latch Release," (14 pages of specification and 4 pages of drawings) and Official Filing Receipt (3 pages).

U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).

U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).

U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).

* cited by examiner

PROXIMITY SWITCH HAVING LOCKOUT CONTROL FOR CONTROLLING MOVABLE PANEL

FIELD OF THE INVENTION

The present invention generally relates to sensors and switches, and more particularly relates to proximity switches for controlling movement of a movable panel to prevent inadvertent activation.

BACKGROUND OF THE INVENTION

Automotive vehicles are typically equipped with various user actuated switches, such as switches for operating devices including powered windows, moonroofs or sunroofs, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Proximity switches are typically configured to detect user actuation of the switch based on a comparison of the sense activation field to a threshold. Inadvertent contact or proximity with the switch may cause a non-intended operation, such as closure of a moonroof. It is desirable to provide for an enhanced proximity switch that reduces or prevent inadvertent activations.

SUMMARY OF THE INVENTION

According to one aspect of the present invention, a proximity sensor for a movable panel is provided. The proximity sensor senses an object in a sense activation field and one or more lockout sensors proximate the proximity sensor for sensing an object. The switch further includes control circuitry controlling movement of a movable panel based on the sensed object in the activation field and the one or more lockout sensors.

According to another aspect of the present invention, a vehicle capacitive switch for controlling a movable panel on a vehicle is provided. The capacitive switch has a capacitive sensor installed in a vehicle for sensing an object in a sense activation field and one or more lockout sensors proximate the capacitive sensor for sensing an object. The switch further includes control circuitry controlling movement of a movable panel based on the sensed object in the activation field and the one or more lockout sensors and preventing movement of the movable panel when the one or more lockout sensors sense an object.

According to a further aspect of the present invention, a method of controlling a movable panel is provided. The method includes the steps of providing a sense activation field with a proximity sensor and processing the sense activation field to sense user activation of the proximity sensor. The method also includes the step of detecting an activation of one or more lockout sensors proximate to the proximity sensor. The method further includes the step of preventing at least some movement of the movable panel when activation of the one or more lockout sensors is detected.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
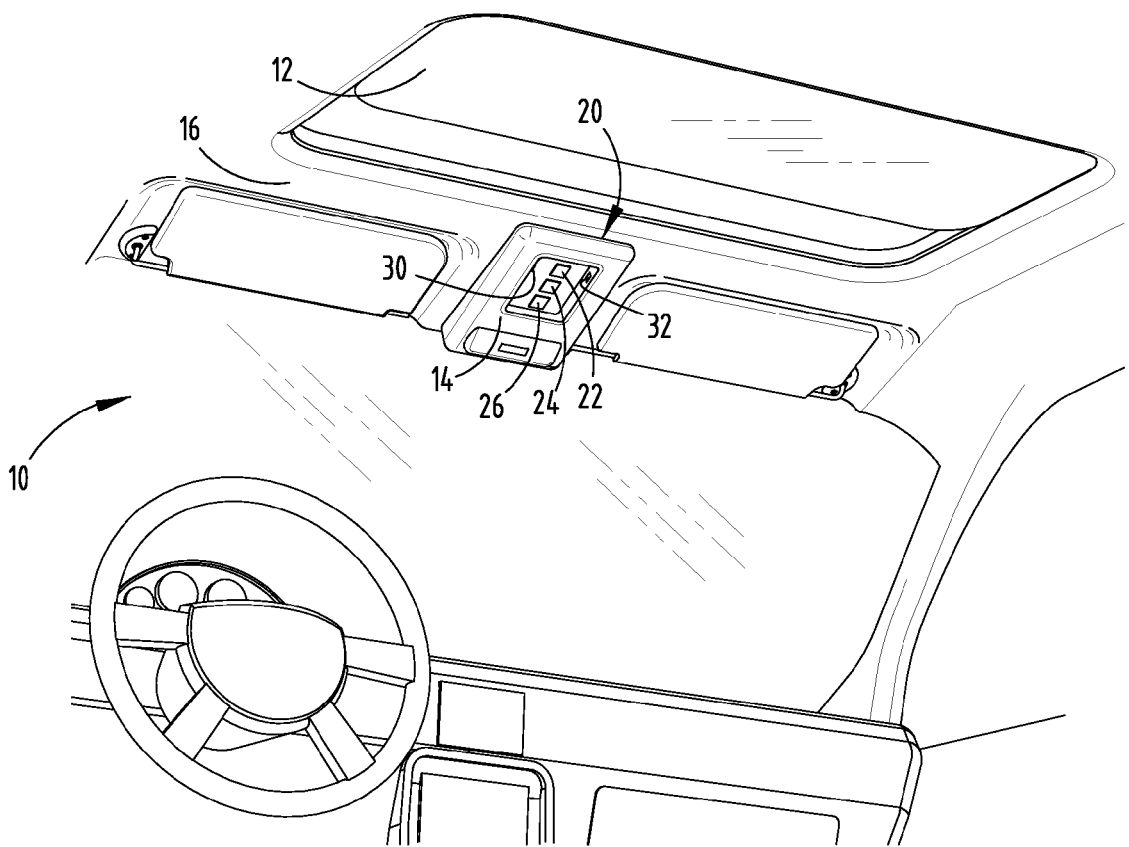
FIG. 1 is a perspective view of an automotive vehicle having a movable moonroof and an overhead console employing proximity switches, according to one embodiment.
Figure 2:
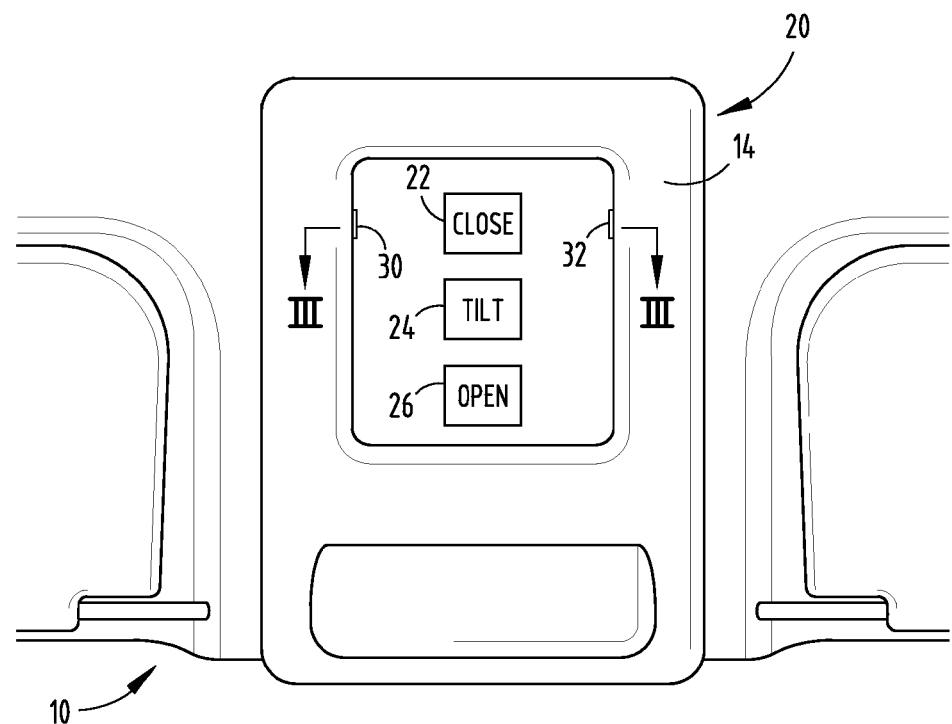
FIG. 2 is an enlarged view of the overhead console further illustrating the proximity switches and lockout switches shown in FIG. 1.

Referring to FIGS. 1 and 2, a movable moonroof 12 and the interior of a passenger compartment 18 of an automotive vehicle 10 is generally illustrated having a switch assembly 20 employing a plurality of proximity switches 22, 24 and 26, according to one embodiment. The vehicle 10 generally includes an overhead console 14 assembled to the headliner 16 on the underside of the roof or ceiling at the top of the passenger compartment 18, generally above the front passenger seating area. The switch assembly 20 having proximity switches 22, 24 and 26 is provided in the overhead console 14, according to one embodiment. The various proximity switches 22, 24 and 26 may control any of a number of vehicle devices and functions, such as controlling movement of the moonroof or sunroof, according to the embodiment shown and disclosed herein. In this embodiment, switch 22, labeled close, may be activated to close the moonroof 12, switch 24, labeled tilt, may be activated to tilt the moonroof to an angled position, and switch 26, labeled open, may be activated to open the moonroof 12. In one embodiment, the moonroof closes completely via a motor pursuant to a one-touch closure process upon detecting a proper single momentary activation of the close switch 22. According to another embodiment, the moonroof closes pursuant to a proportional control process by operating the motor only when close switch 22 is properly activated.

It should be appreciated that these and other proximity switches may be implemented to control any of a number of other vehicle devices and functions relating to movable panels, such as movable lateral side door windows and rear windows. Further, it is contemplated that the switches may be implemented to control other devices including lighting devices, such as interior map/reading and dome lights. It should further be appreciated that the proximity switches 22, 24 and 26 and lockout sensors may be located elsewhere on the vehicle 10, such as in the dash panel, on other consoles such as a center console, integrated into a touch screen display for a radio or infotainment system such as navigation and audio display, or located elsewhere onboard the vehicle 10.

The proximity switches 22, 24 and 26 are shown and described herein as capacitive switches, according to one embodiment. Each proximity switch 22, 24 and 26 includes at least one proximity sensor that provides a sense activation field to sense contact or close proximity of a user in relation to the one or more proximity sensors, such as a swiping motion by a user's finger. Thus, the sense activation field of each proximity switch 22, 24 and 26 is a capacitive field in the exemplary embodiment and the user's finger has electrical conductivity and dielectric properties that cause a change or disturbance in the sense activation field as should be evident to those skilled in the art. It should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22, 24 and 26 shown in FIGS. 1 and 2 each provide control of a vehicle component or device, such as a movable panel to provide a designated control function. One or more of the proximity switches may be dedicated to controlling movement of a sunroof or moonroof 16 so as to cause the moonroof to move in an open or closed direction, tilt the moonroof, or stop movement of the moonroof as described herein based upon a control algorithm. Other proximity switches may be dedicated to control other movable panels, such as actuating door power windows up and down. Various other vehicle controls may be controlled by way of the proximity switches described herein.

Additionally, first and second lockout sensors 30 and 32 are provided on opposite lateral sides of one or more of the proximity switches, such as proximity switch 22. The lockout sensors 30 and 32 are distanced from the proximity switch 22, yet are close proximity or sufficiently close to the proximity sensor 22 to detect inadvertent activation by an object. The lockout sensors 30 and 32 detect contact or close proximity with an object and serve to prevent activation or at least some functionality of a control device or function based on an object detected by the lockout sensors 30 and 32. The lockout sensors 30 and 32 operate to detect an object on opposite sides of the closure switch 22 for purposes of preventing closure of the moonroof 12 when an occupant inadvertently contacts or inadvertently is in close proximity to switch 22. Inadvertent activation may result when a user's knee, elbow or other large object is in close proximity to switch 22, as opposed to the user's finger. According to one embodiment, when both lockout sensors 30 and 32 detect an object, activation of the closure switch 22 is prevented from causing a motor to either close the moonroof 12 pursuant to manual activation or to close the moonroof 12 pursuant to a one-touch closure routine. In a one-touch closure routine 100, a single operation of the switch 22 causes the motor to close the moonroof despite removal of a user's finger from the switch. According to another embodiment, one or more lockout sensors may be employed adjacent to a switch to sense an object and thereby prevent activation of the moonroof 12.

In the capacitive sensor embodiment, the proximity switches 22, 24 and 26 and lockout sensors 30 and 32 each include capacitive plates or electrode pads which may be formed as part of the capacitor and electronic circuitry on a circuit board. The circuit board may be assembled into the overhead console. The overhead console 14 may be sandwiched between the roof and the headliner 16 such that the overhead console 14 extends from the headliner 16. Electrical signals are applied to each of the capacitive switches 22, 24 and 26 and the lockout sensors 30 and 32. According to one embodiment, electronic circuitry provides electrical signals to each of capacitive switches 22, 24 and 26 each having a charge burst length to charge the capacitive sensors. The charge burst length determines the base amplitude of the sense activation field and the sensitivity of the corresponding proximity switches 22, 24 and 26. The lockout sensors 30 and 32 may likewise be capacitive sensors that operate similar to switches 22, 24 and 26.

Figure 3:
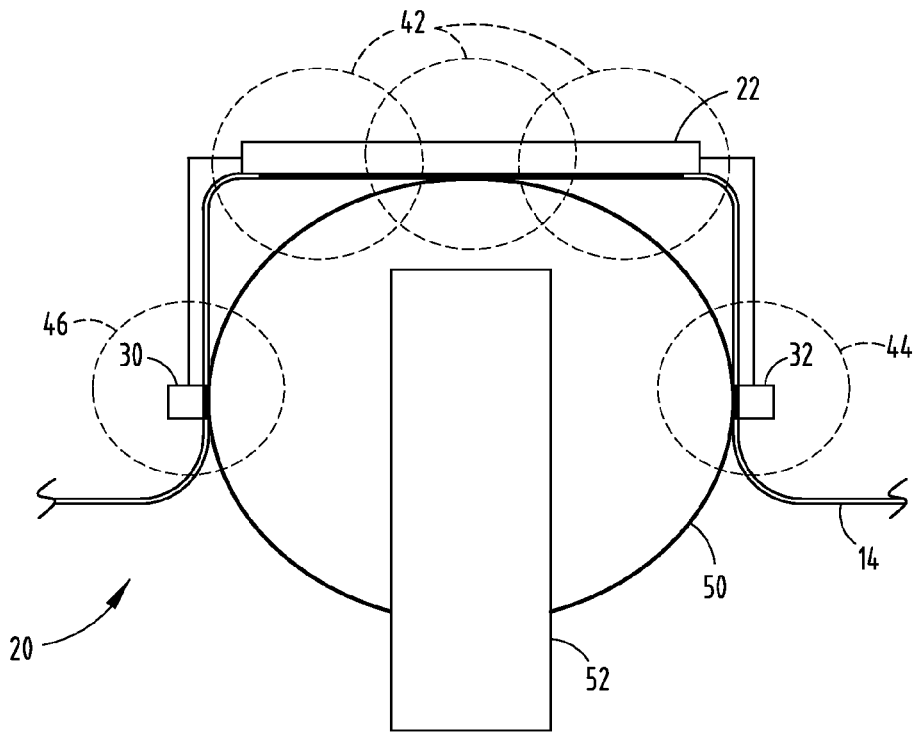
FIG. 3 is a cross-sectional view taken through the close switch further illustrating the proximity sensor and lockout sensors in relation to objects.

Referring to FIG. 3, an example of proximity switch 22 in relation to first and second lockout switches 30 and 32 and a small object 52 (e.g., finger) and large object 50 (e.g., knee) is provided. Proximity switch 22 generates an activation field 42 which may include an array of overlapping fields such as three overlapping fields shown. Each of lockout sensors 30 and 32 generates an actuation field 46 and 44, respectively. In this embodiment, switch 22 is positioned at a location recessed in elevation relative to lockout sensors 30 and 32. The proximity switch 22 is recessed below a contact surface, such that switch 22 has a depth D relative to lockout sensors 30 and 32. Depth D may be in the range of 3-10 mm, and more preferably within 4-7 mm, and Depth D may vary by the size of the expected object and the distances between the lockout sensors, which may be in the range of 15-25 mm, according to one embodiment. By locating proximity switch 22 recessed relative to the lockout sensors 30 and 32, inadvertent contact with switch 22 may be prevented. Further, it should be appreciated that the distance D is small such that the contact surface is more conformable without requiring an excessive depth.

By placing the capacitive switch 22 in a trough, certain objects of a sufficient size such as a knee or arm 50 will always trigger the lockout sensors 30 and 32, whereas a smaller object such as a finger 52 of a user may be swiped in contact or close proximity to switch 22 without activating both lockout sensors 30 and 32. The activation fields for the lockout sensors 30 and 32 may be as sensitive or greater than that of the proximity switch 22, according to one embodiment. According to a more aggressive design approach, the field strength and/or sensitivity of the lockout sensors 30 and 32 may be increased relative to switch 22, such that an object would still trigger the lockout sensors 30 and 32 prior to activation field 42 of switch 22. By keeping the activation fields of the lockout sensors 30 and 32 and switch 22 tight, a finger of a user can actuate the one-touch close switch 22 by touching the switch 22 without triggering both lockout sensors 30 and 32 while still allowing for detection of inadvertent actuation. Each of lockout sensors 30 and 32 produces corresponding activation fields 46 and 44, respectively. Hence, switch 22 may detect an object whenever the object touches the switch 22 or is positioned within the activation field 42. Similarly, the lockout sensors 30 and 32 may detect an object based on contact therewith or when the object is within the corresponding activation fields 46 and 44, respectively.

It should be appreciated that the proximity switch 22 may be actuated by a swiping motion of a user's finger which may contact an outer surface of the sensor housing proximate to switch 22 or may be sufficiently close to the switch 22 such that the finger passes through the sense activation field 42. Activation of proximity switch 22 may cause the device, such as the moonroof to perform a designated function to close the moonroof. Closure is typically achieved via actuation by an electric motor. While a single sensor or activation field may be used, it should be appreciated that a plurality or an array of sensors may be employed to provide a plurality of overlapping activation fields. It should also be appreciated that the activation field 42 may have a rectangular shape or an arched shape field. In the event that a user's hand passes through activation field 42 of sensor 22 and at least one of or both of the sense activation fields 46 and 44 provided by lockout sensors 30 and 32, respectively, activation of the control device is prevented or at least some functionality is controlled. In one embodiment, closure of the moonroof is prevented by preventing actuation of the motor. In another embodiment, closure of the moonroof pursuant to a one-touch closure routine is prevented, which enables the user to manually actuate the switch to close the moonroof provided the user's finger remains in continued contact or close proximity to the switch 22.

Figure 4:
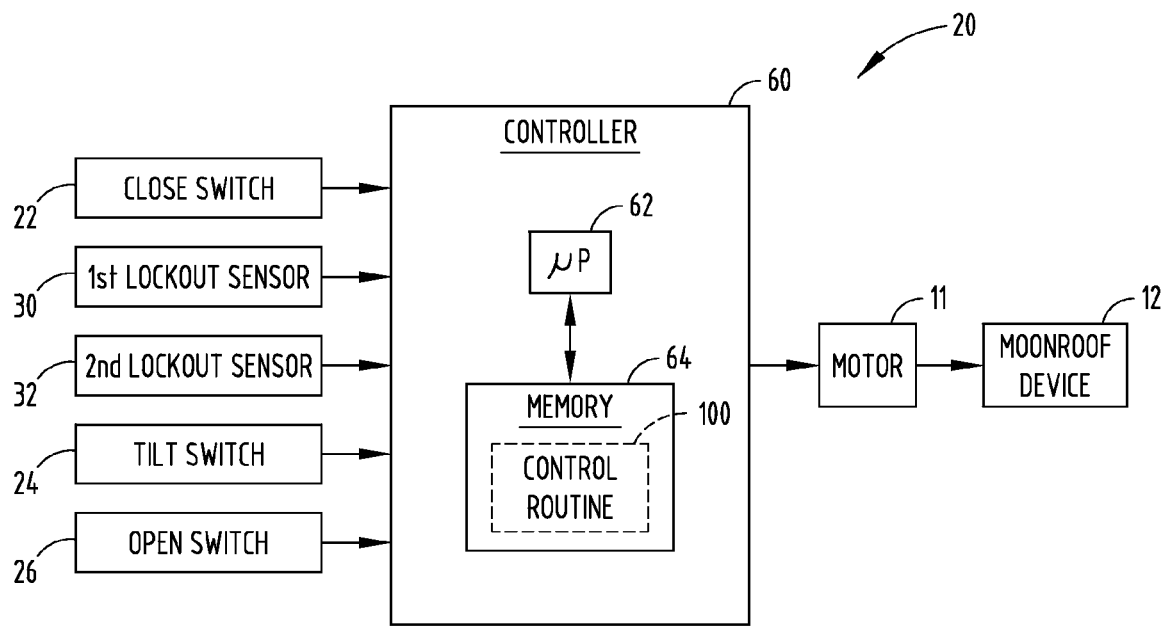
FIG. 4 is a block diagram illustrating a proximity switch having lockout control, according to one embodiment.

Referring to FIG. 4, the proximity switch assembly 20 is illustrated according to one embodiment. Close switch 22, tilt switch 24 and open switch 26 are shown providing inputs to a controller 60. Additionally, the first lockout switch 30 and second lockout switch 32 also provides inputs to the controller 42. The controller 60 may include control circuitry, such as a microprocessor 62 and memory 64. It should be appreciated that other analog and/or digital control circuitry may be employed to provide control of the moonroof device 12 and lockout control thereof. The controller 60 processes one or more routines 100 stored in memory 64 executable by the microprocessor 62 based upon the inputs of one or more of the proximity switches 22, 24, and 26 and the lockout sensors 30 and 32. It should be appreciated that the controller 60 may provide an output to a motor 11 to control activation of a control device 12 such as the moonroof based upon detection of one or more of the lockout sensors 30 and 32 so as to limit at least some of the functionality when one or both of the lockout sensors detect an object at the same time that the close switch 22 detects an object.

The controller 60 provides control outputs to one or more devices, such as the motor 11 of moonroof device 12, based on user activation of the proximity switches 22, 24 and 26 and further based on sensed outputs of the first and second lockout sensors 30 and 32. The moonroof 12 may be controlled to actuate to a closed position based on the activation of the close switch 22 when none of the first and second lockout sensors sense an object, according to one embodiment. According to another embodiment, the moonroof 12 may close whenever the close switch 22 is activated and one or none of the first and second lockout sensors 30 and 32 sense an object.

Figure 5:
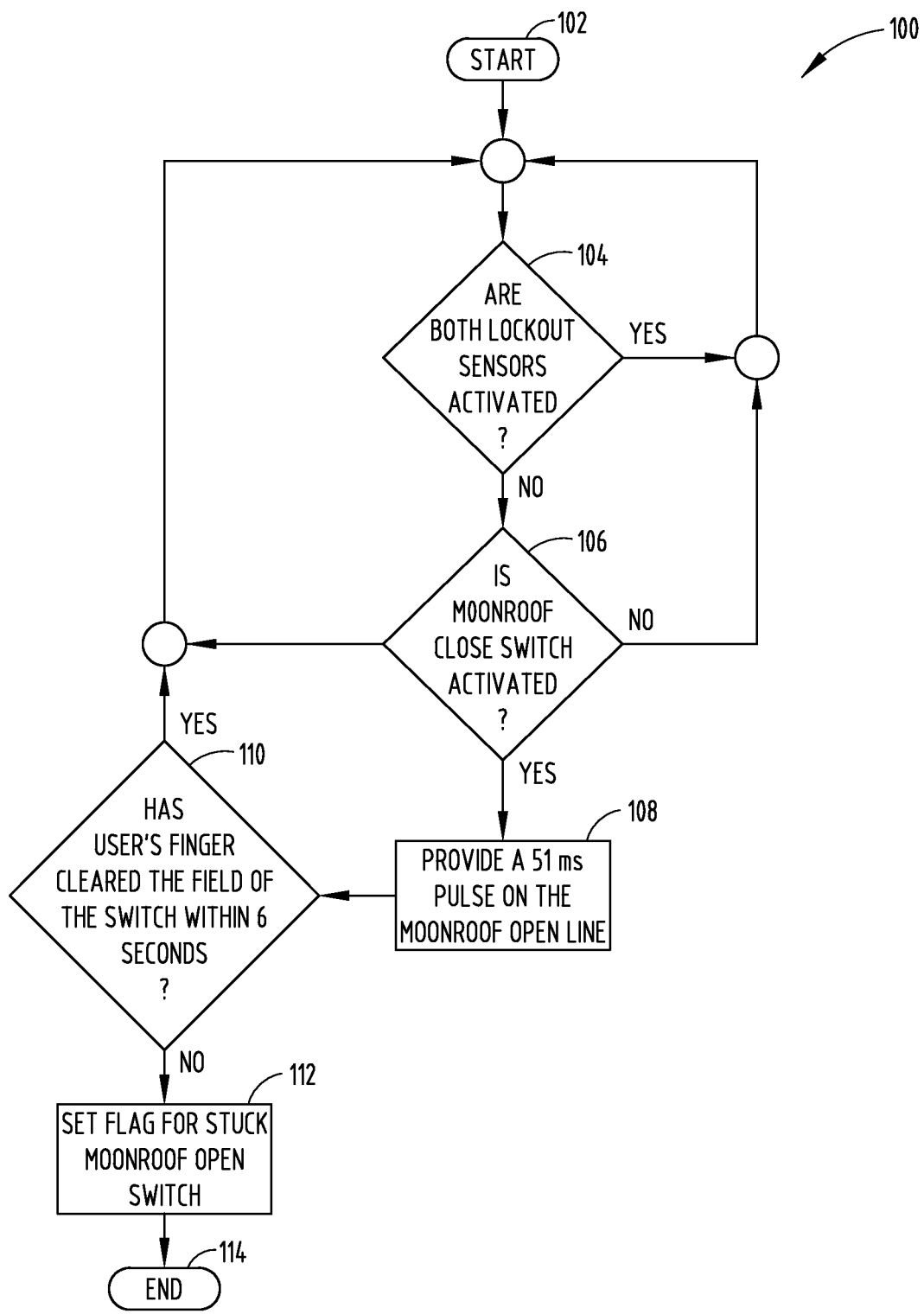
FIG. 5 is a flow diagram illustrating a routine for controlling the moonroof device based on a user input of a proximity switch, according to one embodiment.

Referring to FIG. 5, a control routine 100 is illustrated for controlling operation of a control device based on user activation of a proximity switch and sensed outputs of lockout sensors, according to one embodiment. Routine 100 begins at step 102 and proceeds to decision step 104 to determine if both lockout sensors are activated and, if so, returns to step 104. If both lockout sensors are determined to be activated, routine 100 proceeds to decision step 106 to determine if the moonroof close switch is activated. If the moonroof close switch is activated, routine 100 proceeds to provide a predetermined pulse, such as a 51 millisecond pulse, on the moonroof open line at step 108. Next, routine 100 proceeds to decision block 110 to determine if a user's finger has cleared the field of the switch within six seconds and, returns while the moonroof proceeds to close. If the user's finger has not cleared the field of the switch within six seconds, routine 100 proceeds to step 112 to set a flag for stuck moonroof open switch, and ends at step 114.

Figure 6:
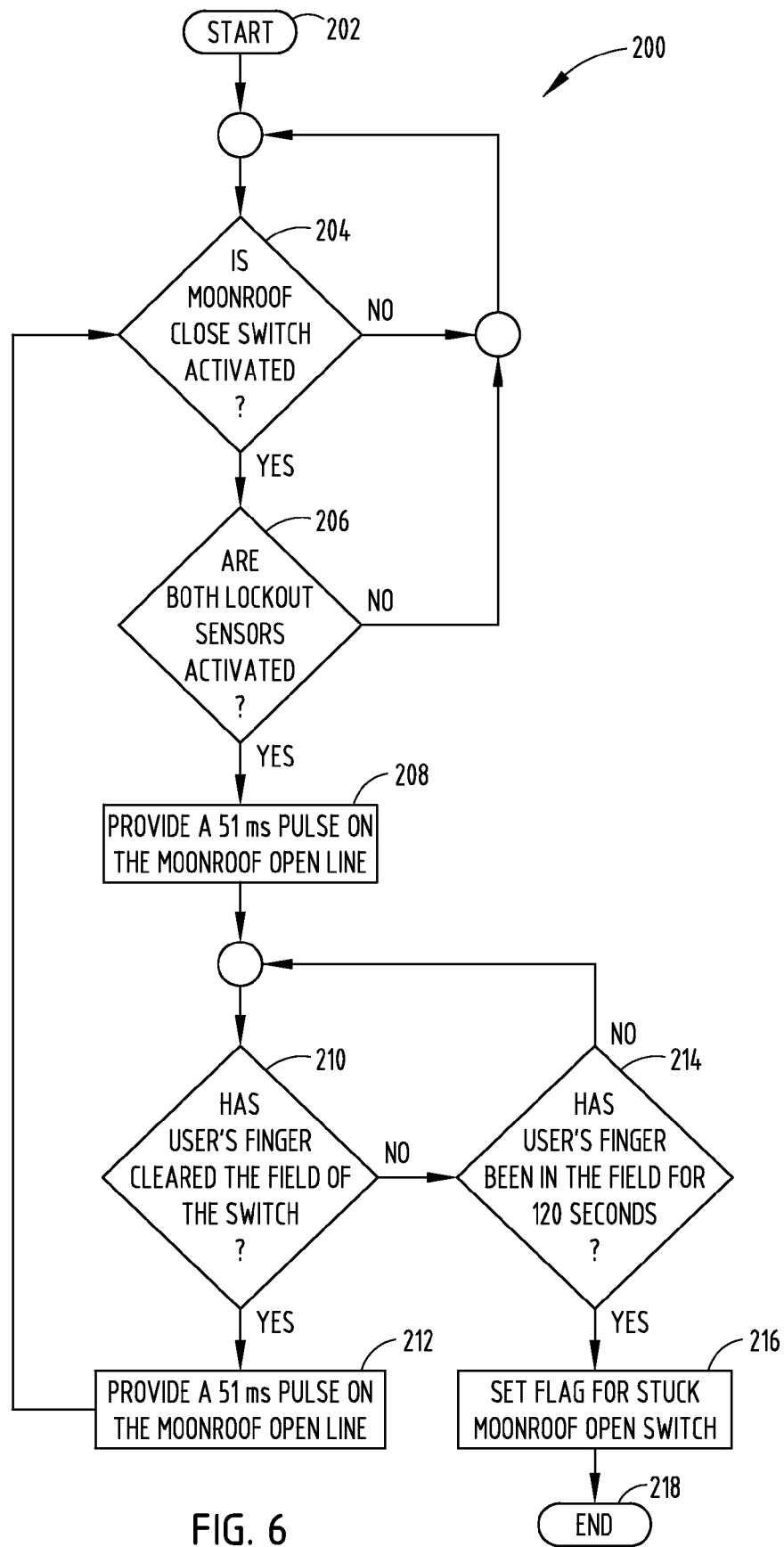
FIG. 6 is a flow diagram illustrating a routine for controlling the moonroof device based on user activation of a proximity switch, according to another embodiment.

Referring to FIG. 6, a control routine 200 is illustrated for controlling operation of a control device, such as a moonroof, based on activation of the proximity switch and lockout sensors, according to another embodiment. In this embodiment, routine 200 begins at step 202 and proceeds to step 204 to determine if the moonroof close switch is activated and, if not, returns. If the moonroof close switch is activated, routine 200 proceeds to decision step 206 to determine if both lockout sensors are activated and, if not, returns to step 206. If both lockout sensors are activated, routine 200 proceeds to step 208 to provide a 51 millisecond pulse on the moonroof open line. Next, routine 200 proceeds to decision step 210 to determine if a user's finger has cleared the field of the switch and, if so, provides a 51 millisecond pulse on the moonroof open line at step 212 before returning to step 204. If the user's finger has not cleared the field of the switch at decision step 210, routine 200 proceeds to decision step 214 to determine if the user's finger has been in the field for 120 seconds and, if so, sets a flag for stuck moonroof open position at step 216 before ending at step 218.

The proximity switch assembly 20 advantageously prevents inadvertent activation of the proximity switch 22 when controlling a movable panel, such as a moon roof or a window of a vehicle, and sensing when large objects come in contact with the proximity sensor 22 and the lockout sensors 30 and 32. Additionally, the proximity switch assembly 20 further allows for passage of a standard test referred to as a knee ball test, which is designed to address the inadvertent actuation of a movable panel control switch. Accordingly, when a specified object, such as a 40 mm ball, is placed in contact with the proximity switch assembly 20, the proximity switch assembly 20 prohibits at least some movement of the control panel based on detection of the object by the lockout sensors 30 and 32.

Accordingly, the proximity switch assembly 20 and method advantageously provides for controlled activation of a proximity switch, such as a capacitive switch, to prevent inadvertent activation of the switch by employing one or more lockout sensors. By employing the lockout sensors, inadvertent activation of a switch, such as for a moonroof may prevent or reduce entrapment of the moonroof closure onto an object when the moonroof inadvertently is activated into the close position, such as via a one-touch closure routine. While the closure panel described herein is a moonroof, it should be appreciated that other closure panels, such as lateral and rear windows of a vehicle may likewise employ the proximity switch assembly with lockout sensors. Further, it should be appreciated that other control devices may employ lockout sensors as described herein.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A proximity switch for controlling a movable panel, comprising:
   a proximity sensor sensing a first object in a sense activation field;
   one or more lockout sensors sensing a second object proximate the proximity sensor; and
   control circuitry controlling movement of a movable panel based on the sensed first object in the activation field and preventing at least some movement of the movable panel when the one or more lockout sensors sense the second object.

2. The proximity switch of claim 1, wherein the control circuitry prevents one-touch closure of the movable panel when the one or more lockout sensors sense the second object.

3. The proximity switch of claim 1, wherein the control circuitry prevents closure of the movable panel when the one or more lockout sensors sense the second object, and wherein the second object is larger than the first object.

4. The proximity switch of claim 1, wherein the proximity switch is installed in a vehicle for use by a passenger in the vehicle to control a movable window panel.

5. The proximity switch of claim 4, wherein the movable window panel comprises a moonroof.

6. The proximity switch of claim 1, wherein the proximity sensor comprises a capacitive sensor.

7. The proximity switch of claim 1, wherein the one or more lockout sensors comprises first and second lockout sensors on opposite sides of the proximity sensor.

8. The proximity switch of claim 7, wherein the control circuitry controls the movable panel to prevent a function when both the first and second lockout sensors are activated.

9. The proximity switch of claim 1, wherein the one or more lockout sensors each comprises a capacitive sensor.

10. The proximity switch of claim 1 further comprising an output for providing an output signal to a motor to control the movable panel.

11. A vehicle capacitive switch for controlling a movable panel on a vehicle, comprising:
   a capacitive sensor installed in a vehicle for sensing a first object in a sense activation field;
   one or more lockout sensors for sensing a second object proximate the capacitive sensor; and
   control circuitry controlling movement of the movable panel based on the sensed first object in the activation field and the one or more lockout sensors, and preventing movement of the movable panel when the one or more lockout sensors sense the second object.

12. A method of controlling a movable panel, said method comprising;
   providing a sense activation field with a proximity sensor;
   processing the sense activation field to sense a first object during user activation of the proximity sensor;
   detecting an activation of one or more lockout sensors with a second object proximate to the proximity sensor; and
   preventing at least some movement of the movable panel when activation of the one or more lockout sensors is detected.

13. The method of claim 12, wherein the proximity sensor is installed in a vehicle for use by a passenger in the vehicle.

14. The method of claim 13, wherein the movable panel comprises a moonroof.

15. The method of claim 12, wherein a one-touch closure of the movable panel is prevented when actuation of the one or more lockout sensors is detected.

16. The method of claim 12, wherein closure of the movable panel is prevented when activation of the one or more lockout sensors is detected, and wherein the second object is larger than the first object.

17. The method of claim 12, wherein the proximity sensor comprises a capacitive sensor.

18. The method of claim 12, wherein the one or more lockout sensors comprise first and second lockout sensors on opposite sides of the proximity sensor.

19. The method of claim 12, wherein movement of the movable panel is prevented when both the first and second lockout sensors are activated.

* * * * *